(12) United States Patent
Nakada

(10) Patent No.: US 11,152,554 B2
(45) Date of Patent: Oct. 19, 2021

(54) THERMOELECTRIC CONVERSION ELEMENT

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/957,968

(22) PCT Filed: Mar. 15, 2019

(86) PCT No.: PCT/JP2019/010818
§ 371 (c)(1),
(2) Date: Jun. 25, 2020

(87) PCT Pub. No.: WO2019/177147
PCT Pub. Date: Sep. 19, 2019

(65) Prior Publication Data
US 2020/0373474 A1    Nov. 26, 2020

(30) Foreign Application Priority Data

Mar. 16, 2018 (JP) .............................. JP2018-049874
Mar. 6, 2019 (JP) .............................. JP2019-040845

(51) Int. Cl.
*H01L 35/22* (2006.01)
*C22C 9/10* (2006.01)
(Continued)

(52) U.S. Cl.
CPC ........ *H01L 35/22* (2013.01); *C04B 35/58085* (2013.01); *C22C 1/051* (2013.01);
(Continued)

(58) Field of Classification Search
CPC ......... H01L 35/08; H01L 35/20; H01L 35/22; H01L 35/04; H01L 35/10; C04B 35/58085; C22C 1/051; C22C 9/10
See application file for complete search history.

(56) References Cited

U.S. PATENT DOCUMENTS

2011/0099991 A1* 5/2011 Stefan .................... H01L 35/04
60/320
2015/0280099 A1* 10/2015 Boukai ................... H01L 35/32
136/203
(Continued)

FOREIGN PATENT DOCUMENTS

JP    07-202274 A    8/1995
JP    2003-234516 A    8/2003
(Continued)

OTHER PUBLICATIONS

International Search Report dated Jun. 18, 2019, issued for PCT/JP2019/010818 and English translation thereof.

*Primary Examiner* — Lindsey A Bernier
(74) *Attorney, Agent, or Firm* — Locke Lord LLP; James E. Armstrong, IV; Nicholas J. DiCeglie, Jr.

(57) ABSTRACT

A thermoelectric conversion element includes an element body formed of a thermoelectric conversion material of a silicide-based compound, and electrodes each formed on one surface of the element body and the other surface opposite the one surface. The electrodes are formed of a sintered body of a copper silicide, and the electrodes and the element body are directly joined.

16 Claims, 3 Drawing Sheets

(51) Int. Cl.
    *C04B 35/58*          (2006.01)
    *C22C 1/05*           (2006.01)
    *H01L 35/08*          (2006.01)
    *H01L 35/04*          (2006.01)
    *H01L 35/10*          (2006.01)

(52) U.S. Cl.
    CPC ................ *C22C 9/10* (2013.01); *H01L 35/04* (2013.01); *H01L 35/08* (2013.01); *H01L 35/10* (2013.01)

(56) References Cited

U.S. PATENT DOCUMENTS

2017/0222008 A1*   8/2017   Hsu .................. H01L 21/76889
2018/0226556 A1*   8/2018   Jacquot .................. H01L 35/34

FOREIGN PATENT DOCUMENTS

| JP | 2006-339283 A | 12/2006 | |
|---|---|---|---|
| JP | 2013-201382 A | 10/2013 | |
| WO | 2012/073946 A1 | 6/2012 | |
| WO | WO-2017032943 A1 * | 3/2017 | ............. H01L 35/30 |

* cited by examiner

THERMOELECTRIC CONVERSION ELEMENT

TECHNICAL FIELD

The present invention relates to a thermoelectric conversion element including an element body formed of a thermoelectric conversion material of a silicide-based compound, and electrodes each formed on one surface of the element body and the other surface opposite the one surface.

Priority is claimed on Japanese Patent Application No. 2018-049874, filed Mar. 16, 2018 and Japanese Patent Application No. 2019-040845, filed Mar. 6, 2019, the contents of which are incorporated herein by reference.

BACKGROUND ART

A thermoelectric conversion element formed of a thermoelectric conversion material is an electronic element that uses phenomena such as Seebeck effect and Peltier effect and is capable of mutually converting heat and electricity. The Seebeck effect is an effect of converting heat energy into electric energy, and is a phenomenon in which an electromotive force is generated when a temperature difference is generated between both ends of a thermoelectric conversion material. Such an electromotive force depends on characteristics of the thermoelectric conversion material. In recent years, thermoelectric power generation utilizing the effect is actively developed.

As an index representing a characteristic of the thermoelectric conversion element (thermoelectric conversion material), for example, a power factor (PF) represented by Equation (1) below or a dimensionless performance index (ZT) represented by Equation (2) below is used. In the thermoelectric conversion material, it is necessary to maintain a temperature difference between one surface and the other surface side. Therefore, it is preferable that the thermoelectric conversion material has a low thermal conductivity.

$$PF = S^2 \sigma \quad (1)$$

Here, S: Seebeck coefficient (V/K), σ: Electric conductivity (S/m)

$$ZT = S^2 \sigma T / \kappa \quad (2)$$

Here, T=Absolute temperature (K), κ=Thermal conductivity (W/(m×K))

Examples of the thermoelectric conversion material forming the element body include a silicide-based compound such as magnesium silicide.

The thermoelectric conversion element described above has a structure in which electrodes are each formed on one end side and the other end side of the thermoelectric conversion material. For the electrode formed on the element body formed of the thermoelectric conversion material of the silicide-based compound such as magnesium silicide, nickel is used. This is because a thermal expansion coefficient of the magnesium silicide ($Mg_2Si$) at room temperature ($15.5 \times 10^{-6}$ (/° C.)) and a thermal expansion coefficient of the nickel at room temperature ($15.2 \times 10^{-6}$ (/° C.)) are approximate.

However, when the thermoelectric conversion element described above is used at a medium temperature range (300° C. or higher and 600° C. or lower), Si of the silicide-based compound of the element body diffuses to the electrode side, and nickel of the electrode becomes nickel silicide. Since the nickel silicide has a thermal expansion coefficient of $12.0 \times 10^{-6}$ (/° C.) at room temperature, a difference in thermal expansion coefficient between the nickel silicide and the element body formed of the thermoelectric conversion material of the silicide-based compound becomes large, and there was a concern that cracks may occur in the element body. In addition, a composition in the vicinity of an interface region of the element body with the electrode changes, and there was a concern that electric resistance increases or strength is reduced.

Therefore, for example, Patent Document 1 proposes a thermoelectric conversion element in which an intermediate layer formed of a metal silicide with a high melting point is formed between an element body formed of a thermoelectric conversion material and an electrode. In the thermoelectric conversion element, diffusion of an element between the element body and the electrode is suppressed by the intermediate layer formed of the metal silicide with a high melting point.

In addition, Patent Document 2 proposes a thermoelectric conversion element using a mixture of a nickel silicide and metallic nickel, as an electrode.

CITATION LIST

Patent Literature

[Patent Document 1]
Japanese Unexamined Patent Application, First Publication No. Hei 07-202274
[Patent Document 2]
Republished Japanese Translation No. WO2012/073946 of the PCT International Publication for Patent Applications

SUMMARY OF INVENTION

Technical Problem

However, in the thermoelectric conversion element of Patent Document 1, the intermediate layer formed of the metal silicide with a high melting point is deposited by a vapor deposition method, a sputtering method, or a CVD method, and the intermediate layer could not be formed efficiently. In addition, it was difficult to form the intermediate layer to be thick. Therefore, there was a concern that the intermediate layer cannot sufficiently suppress diffusion of an element of the electrode to the element body.

In the thermoelectric conversion element of Patent Document 2, the nickel silicide is used as the electrode. However, the nickel silicide has a large difference in thermal expansion coefficient from the element body formed of magnesium silicide or the like, as described above, and there was a concern that a crack may occur in the element body or the electrode due to thermal stress caused by thermal history during manufacturing. Further, in a case where the metallic nickel is in direct contact with the element body formed of magnesium silicide or the like, Si in the element body diffuses to the metallic nickel side and a composition in the vicinity of an interface region of the element body changes. There was a concern that electric resistance increases or strength is reduced.

The present invention was made in view of circumstances described above, and an object of the present invention is to provide a thermoelectric conversion element in which an element body formed of a thermoelectric conversion material of a silicide-based compound and an electrode are reliably joined, electric resistance in a joining interface is sufficiently low, and occurrence of a crack in the element body or the electrode can be suppressed.

Solution to Problem

In order to solve the problems described above, a thermoelectric conversion element of the present invention includes an element body formed of a thermoelectric conversion material of a silicide-based compound; and electrodes each formed on one surface of the element body and the other surface opposite the one surface, in which the electrodes are formed of a sintered body of a copper silicide, and the electrodes and the element body are directly joined.

According to the thermoelectric conversion element, since the electrodes are formed of the sintered body of the copper silicide, a difference in a thermal expansion coefficient from the element body formed of the thermoelectric conversion material of the silicide-based compound can be reduced. Since the copper silicide has a relatively low melting point, a liquid phase is generated in at least a part of the copper silicide when forming a sintered body to be an electrode, and thermal strain can be released. Accordingly, occurrence of a crack in the element body or the electrode during manufacturing can be suppressed. When forming the sintered body to be an electrode, the entire copper silicide may be in a liquid phase.

In addition, since the electrodes and the element body are directly joined, and further, as described above, a liquid phase is generated in at least a part of the copper silicide when forming the sintered body to be the electrode, the electrodes and the element body can be sufficiently joined and electric resistance at an interface can be suppressed to be sufficiently low.

In the thermoelectric conversion element of the present invention, a metal layer may be formed on an opposite surface of the electrode from the element body. In this case, the metal layer formed on the opposite surface from the element body can improve joinability to a terminal.

In the thermoelectric conversion element of the present invention, it is preferable that a thickness of the electrode is in a range of 10 μm or larger and 300 μm or smaller. In this case, by setting the thickness of the electrode to 300 μm or smaller, rigidity of the electrode does not increase more than necessary, and the occurrence of a crack in the element body during manufacturing can be suppressed. On the other hand, by setting the thickness of the electrode to 10 μm or larger, electric conductivity of the electrode can be secured.

In the thermoelectric conversion element of the invention, the electrodes are formed of the sintered body of the copper silicide, and it is preferable that an atom number ratio Si/Cu between Si and Cu in the copper silicide is in a range of 0.12 or more and 0.4 or less. In this case, since the atom number ratio Si/Cu between Si and Cu in the copper silicide forming the electrode is in the range of 0.12 or more and 0.4 or less, the electric conductivity of the electrode can be secured high, and the occurrence of a crack in the element body during manufacturing can be suppressed.

Further, in the thermoelectric conversion element of the present invention, the electrodes are formed of the sintered body of the copper silicide, and it is preferable that a porosity of the copper silicide is 60% or lower. In this case, since the porosity of the copper silicide forming the electrode is set to 60% or lower, an increase in electric resistance can be suppressed.

Advantageous Effects of Invention

According to the present invention, the element body formed of a thermoelectric conversion material of a silicide-based compound and an electrode are reliably joined, electric resistance in an interface is sufficiently low, and occurrence of a crack in the element body or the electrode can be suppressed.

DESCRIPTION OF EMBODIMENTS

Figure 1:
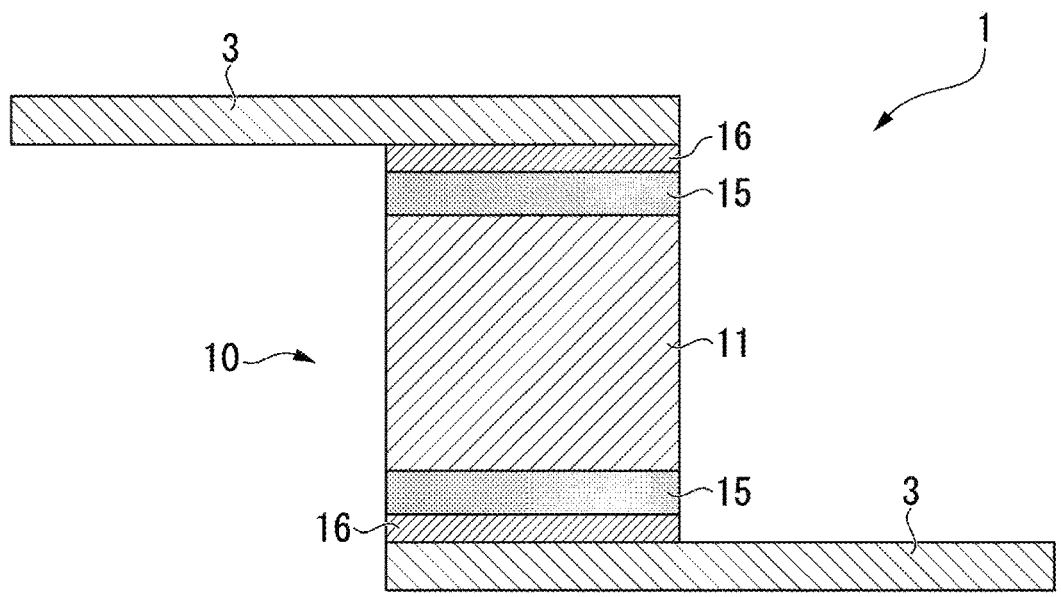
FIG. 1 is a sectional view showing a thermoelectric conversion element according to a first embodiment of the present invention and a thermoelectric conversion module using the thermoelectric conversion element.

Hereinafter, a thermoelectric conversion element according to an embodiment of the present invention will be described with reference to accompanying drawings. Each embodiment below is specifically described for better understanding of the gist of the invention, and does not limit the present invention unless otherwise specified. In the drawings used in the following description, for convenience, in order to make the features of the present invention easy to understand, a portion that is a main part may be enlarged in some cases, and a dimensional ratio or the like of each component is not always the same as an actual one.

Figure 2:
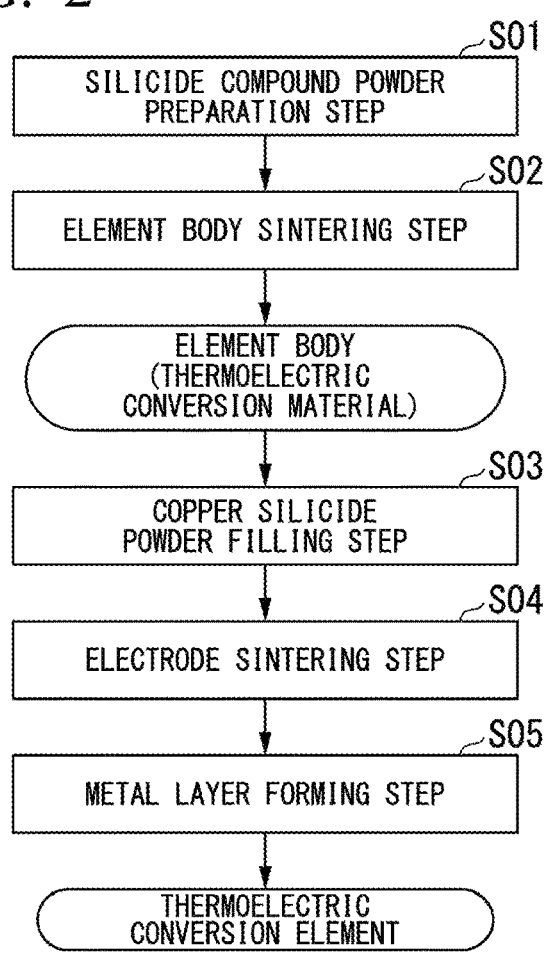
FIG. 2 is a flowchart showing an example of a method for manufacturing a thermoelectric conversion element according to an embodiment of the present invention.

A thermoelectric conversion element 10 according to an embodiment of the present invention will be described with reference to FIGS. 1 to 3. FIG. 1 shows the thermoelectric conversion element 10 according to a first embodiment of the present invention and a thermoelectric conversion module 1 using the thermoelectric conversion element 10. The thermoelectric conversion module 1 shown in FIG. 1 includes the thermoelectric conversion element 10 and terminals 3 and 3 provided on one surface and the other surface of the thermoelectric conversion element 10.

The thermoelectric conversion element 10 includes an element body 11 formed of a thermoelectric conversion material, and electrodes 15 and 15 each formed on one surface and the other surface of the element body 11. As shown in FIG. 1, the element body 11 is formed in a column shape, and electrodes 15 and 15 are respectively provided on both end surfaces of the column shape. The shape of the element body 11 is not limited, and may be a rectangular parallelepiped, a column, a polygonal column, an elliptical column, or the like. Both surfaces of the element body 11 to which the electrodes 15 and 15 are joined may be parallel to each other or may be slightly inclined.

A thermoelectric conversion material forming the element body 11 is formed of, for example, a silicide-based compound. In the present embodiment, the thermoelectric conversion material is preferably formed of a sintered body of magnesium silicide ($Mg_2Si$). Examples of the silicide-based compound that can be used other than the magnesium silicide include silicon germanium (Si—Ge) homogeneous solid solution, manganese silicon (Mn—Si), and iron silicon (Fe—Si).

The thermoelectric conversion material forming the element body 11 may include at least one of Li, Na, K, B, Al, Ga, In, N, P, As, Sb, Bi, Ag, Cu, and Y, as a dopant. In a case of containing a dopant, a total content thereof in the element body 11 is preferably 0.1 mass % or more and 3.0 mass % or less, but is not limited to the range.

In the thermoelectric conversion element 10, the electrode 15 is formed of a sintered body of copper silicide, and the electrode 15 and the element body 11 are directly joined. The electrode 15 in this example has the same planar shape as the end surface of the element body 11.

In addition, in the present embodiment, as shown in FIG. 1, a metal layer 16 is formed on an opposite surface of the electrode 15 from the element body 11. That is, the metal layer 16 is provided between the electrode 15 and the terminal 3. The metal layer 16 in this example has the same planar shape as the electrode 15.

It is preferable that a thickness of the electrode 15 formed of the sintered body of the copper silicide is in a range of 10 μm or larger and 300 μm or smaller. If the thickness of the electrode 15 formed of the sintered body of the copper silicide is 10 μm or larger, electric conductivity of the electrode 15 can be secured. If the thickness of the electrode 15 formed of the sintered body of the copper silicide is 300 μm or smaller, the rigidity of the electrode 15 does not increase more than necessary, and the occurrence of a crack in the element body 11 during manufacturing can be suppressed.

The lower limit of the thickness of the electrode 15 formed of the sintered body of the copper silicide is more preferably 50 μm or larger. The upper limit of the thickness of the electrode 15 formed of the sintered body of the copper silicide is more preferably 150 μm or smaller.

In the copper silicide forming the electrode 15, an atom number ratio Si/Cu between the Si and Cu is preferably in a range of 0.12 or more and 0.4 or less.

The copper silicide forming the electrode 15 is obtained by mixing and firing copper silicide powders having a plurality of compositions (Si/Cu), and is adjusted so that an average value thereof is in the range described above. For example, specific examples of copper silicide include $Cu_3Si$ (atom number ratio 1/3) or $Cu_7Si$ (atom number ratio 1/7), and these can be mixed and used as a sintering raw material.

In a case where the atom number ratio Si/Cu of the copper silicide forming the electrode 15 is 0.12 or more, the sintering raw material is a copper silicide powder formed by a single phase of $Cu_7Si$ or a mixture of $Cu_7Si$ and a small amount of a copper silicide having another composition. When melting the entirety or a part of the sintering raw material, electric conduction in the electrode 15 can be secured and a crack in the element body 11 can be suppressed.

In a case where the atom number ratio Si/Cu of the copper silicide forming the electrode 15 is 0.4 or less, the sintering raw material is a copper silicide powder formed by a single phase of $Cu_3Si$ or a mixture of $Cu_3Si$ and a small amount of a copper silicide having another composition. When melting the entirety or a part of the sintering raw material, electric conduction of the electrode 15 can be secured and a crack in the element body 11 during manufacturing can also be suppressed.

A lower limit of the atom number ratio Si/Cu of the copper silicide forming the electrode 15 is more preferably 0.13 or more. An upper limit of the atom number ratio Si/Cu of copper silicide forming the electrode 15 is more preferably 0.35 or less.

In the electrode 15 of the present embodiment, as described above, since copper silicide powders having a plurality of compositions (Si/Cu) are mixed and fired, a liquid phase is formed at least on a part thereof during sintering and the electrode 15 has a liquid phase solidified portion formed by solidification of the liquid phase on a part thereof. The liquid phase solidified portion has fewer pores and a locally higher density, than a region where the liquid phase is not formed.

The porosity of the electrode 15 as an entirety is not limited in the present invention, and is preferably 0 volume % or higher and 60 volume % or lower, and more preferably 0 volume % or higher and 50 volume % or lower. The distribution of the liquid phase solidified portion in the electrode 15 is not limited, and it is preferable that the liquid phase solidified portion is concentrated on the element body 11 side and distributed in a layered manner, from a viewpoint of stress relaxation. However, in the present invention, the liquid phase solidified portion may be distributed almost uniformly over the entire region in the electrode 15 or may be concentrated on the metal layer 16 side and distributed in a layered manner.

The porosity of the electrode 15 was determined by a method below.

First, weight of a silicide sintered body before forming the copper silicide electrode is measured. Then, after the electrodes are formed, the thickness of the electrode on each of both surfaces is measured at five places with an optical microscope or a scanning electron microscope, and an average thereof is determined. Then, the size (such as vertical width, lateral width, and radius) of an electrode surface on each of both surfaces is measured with a caliper or a micrometer, and a surface area of the electrode surface on each of both surfaces is determined. From the surface area and the thickness of the electrode on each of both surfaces, a volume of an electrode part on each of both surfaces is determined. Then, the weight of the silicide sintered body and the electrodes which are in an integrated state is measured, and a weight of the silicide sintered body is subtracted therefrom. Accordingly, the weight of an electrode part is determined. The density of the electrode part is determined from the weight and the volume of the electrode part on both surfaces. The density determined in this manner is defined as a measured density. On the other hand, a true density was estimated and calculated from an average composition obtained by analyzing the electrode layer by EPMA, and a porosity was calculated from a formula of (100−(Measured density/True density×100) (%)).

The metal layer 16 is formed of, for example, metal excellent in conductivity, such as nickel, aluminum, and copper. In the present embodiment, it is preferable that the metal layer 16 is formed of aluminum. The metal layer 16 is formed by joining a metal foil or the like to the electrode 15 by, for example, brazing. The thickness of the metal layer 16 is not limited, and is preferably in a range of 0.1 mm or larger and 2.0 mm or smaller.

The terminal 3 is formed of a metal material excellent in conductivity, for example, a plate material of copper, aluminum, or the like. In the present embodiment, it is preferable to use a rolled plate of aluminum. The metal layer 16 formed on the electrode 15 and the terminal 3 can be joined by, for example, Ag brazing, Ag plating, or the like. The pair of terminals 3 of the present embodiment extend to opposite sides as viewed from the element body 11 and are disposed parallel to each other, but the present invention is not limited to this disposition.

Next, an example of a method for manufacturing the thermoelectric conversion element 10 described above will be described with reference to FIGS. 2 and 3.

(Silicide Compound Powder Preparation Step S01)

First, a silicide compound powder (magnesium silicide powder) to be a parent phase of the thermoelectric conversion material forming the element body is prepared. In a silicide compound powder preparation step S01, a silicide compound ingot (magnesium silicide) is manufactured, and this ingot is pulverized and sieved to manufacture a silicide compound powder (magnesium silicide powder) having a predetermined particle size. Commercially available magnesium-based compound powder (magnesium silicide powder) may be used. The average particle size of the silicide compound powder (magnesium silicide powder) is preferably in a range of 0.5 μm or larger and 100 μm or smaller.

(Element Body Sintering Step S02)

Then, the silicide compound powder obtained as described above is heated while pressurizing to obtain a sintered body. In the present embodiment, in an element body sintering step S02, the sintering apparatus (electric sintering apparatus 100) shown in FIG. 3 is used.

Figure 3:
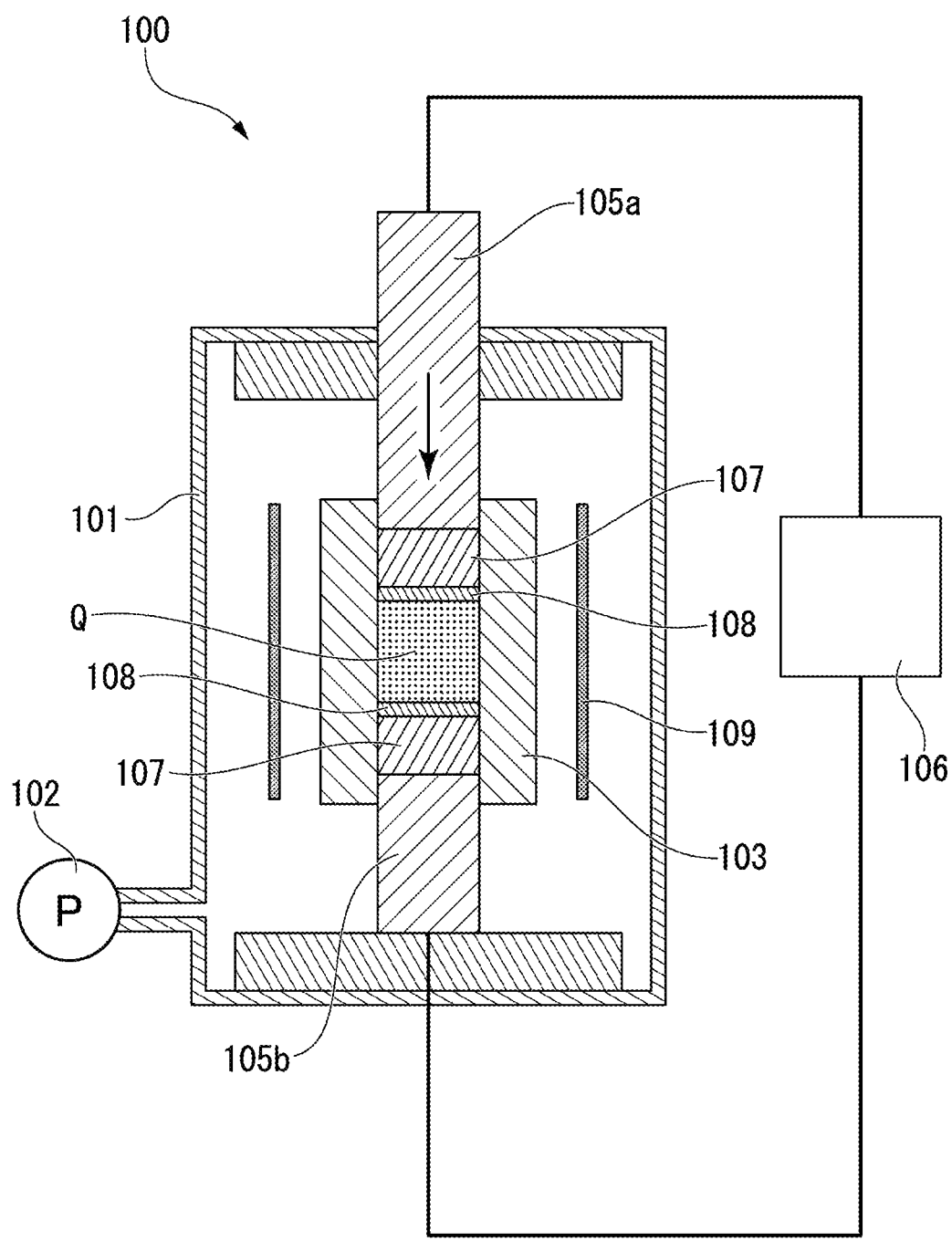
FIG. 3 is a sectional view showing an example of a sintering apparatus used in the method for manufacturing a thermoelectric conversion element shown in FIG. 2.

The sintering apparatus (electric sintering apparatus 100) shown in FIG. 3 includes, for example, a pressure-resistant housing 101, a vacuum pump 102 for reducing the pressure inside the pressure-resistant housing 101, and a hollow cylindrical carbon mold 103 disposed inside the pressure-resistant housing 101, a pair of electrode portions 105a and 105b for applying a current while pressurizing a sintering raw material powder Q with which the carbon mold 103 is filled, and a power supply device 106 for applying a voltage between the pair of electrode portions 105a and 105b. A carbon plate 107 and a carbon sheet 108 are respectively disposed between the electrode portions 105a and 105b and the sintering raw material powder Q. In addition to these, a thermometer, a displacement gauge, and the like (which are not shown) are provided.

In the present embodiment, a heater 109 is provided on an outer peripheral side of the carbon mold 103. The heater 109 is disposed on four sides so as to cover the entire surface of the carbon mold 103 on outer peripheral side. As the heater 109, a carbon heater, a nichrome wire heater, a molybdenum heater, a Kanthal wire heater, a high frequency heater, or the like can be used.

In the element body sintering step S02, first, the carbon mold 103 of the electric sintering apparatus 100 shown in FIG. 3 is filled with the sintering raw material powder Q. For example, the inside of the carbon mold 103 is covered with a graphite sheet or a carbon sheet. A direct current is applied between the pair of electrode portions 105a and 105b by using the power supply device 106, and the current is applied to the sintering raw material powder Q. Accordingly, a temperature increases by self-heating (electric heating). Between the pair of electrode portions 105a and 105b, the electrode portion 105a on a movable side is caused to move toward the sintering raw material powder Q, and the heater 109 is heated while pressurizing the sintering raw material powder Q at a predetermined pressure between the electrode portion 105a and the electrode portion 105b on a fixed side. Accordingly, the sintering raw material powder Q is sintered by the self-heating of the sintering raw material powder Q, the heat from the heater 109, and the pressurizing.

In the present embodiment, sintering conditions in the element body sintering step S02 are as follows: a heating temperature of the sintering raw material powder Q is in a range of 650° C. or higher and 1030° C. or lower, and a holding time at the heating temperature is in a range of 0 minutes or longer (for example, 1 second or longer) and 3 minutes or shorter. Pressurizing load is 15 MPa or more and 60 MPa or less. It is preferable that atmosphere in the pressure-resistant housing 101 is set to an inert atmosphere such as an argon atmosphere or a vacuum atmosphere. When the vacuum atmosphere is set, it is preferable to set the pressure to 5 Pa or less.

In the element body sintering step S02, when the direct current is applied to the sintering raw material powder Q, it is preferable that polarities of the one electrode portion 105a and the other electrode portion 105b change at a predetermined time interval. In other words, an energizing state in which the one electrode portion 105a is used as an anode and the other electrode portion 105b is used as a cathode, and an energizing state in which the one electrode portion 105a is used as a cathode and the other electrode portion 105b is used as an anode are performed alternately. In the present embodiment, it is preferable that the predetermined time interval is set in a range of 10 seconds or longer and 300 seconds or shorter. According to the above steps, the element body 11 (thermoelectric conversion material) is manufactured. By alternately switching the direction of the current, an advantage that homogeneity of the element body 11 is improved can be obtained.

(Copper Silicide Powder Filling Step S03)

Next, the carbon mold 103 of the electric sintering apparatus 100 is filled with the copper silicide powder and the sintered body of the silicide compound. The carbon sheets on both end surfaces and side surfaces of the sintered body of the silicide compound are removed, and both end surfaces of the sintered body are polished with abrasive paper. The carbon plate 107 and the carbon sheet 108 are inserted into the carbon mold 103, and the carbon mold 103 is filled with a predetermined amount of copper silicide powder. Thereafter, a sintered body of the silicide compound is inserted thereto, and the carbon mold 103 is further filled with a predetermined amount of the copper silicide powder thereon. Then, the carbon plate 107 and the carbon sheet 108 are disposed thereon.

It is preferable to use a copper silicide powder having an average particle size of 0.5 μm or greater and 50 μm or smaller. In the present embodiment, a mixture of copper silicide powders having a plurality of compositions (mass ratio Si/Cu) is used as the copper silicide powder.

(Electrode Sintering Step S04)

When a direct current is applied between the pair of electrode portions 105a and 105b by using the power supply device 106 of the electric sintering apparatus 100, the temperature increases by self-heating (electric heating). Pressurizing is performed at a predetermined pressure by using the pair of electrode portions 105a and 105b. In addition, the heater 109 is heated. Accordingly, the electrode 15 is formed by sintering the copper silicide powder, and the electrode 15 and the element body 11 are directly joined.

In the present embodiment, sintering conditions in the electrode sintering step S04 are preferably as follows: a heating temperature is in a range of 650° C. or higher and 850° C. or lower, and a holding time at the heating temperature is in a range of 0 minutes or longer (for example, 1 second or longer) and 3 minutes or shorter. It is preferable that pressurizing load is in a range of 2 MPa or more and 40 MPa or less. It is preferable that an atmosphere in the pressure-resistant housing 101 is set to an inert atmosphere such as an argon atmosphere or a vacuum atmosphere. In a case where the vacuum atmosphere is set, it is preferable that the pressure is set to 5 Pa or less.

In the present embodiment, since a mixture of the copper silicide powders having a plurality of compositions (atom number ratio Si/Cu) is used as the copper silicide powder, a liquid phase is generated on a part in the electrode sintering step S04, and a liquid phase solidified portion formed by solidification of the liquid phase on a part of the electrode 15 is formed. The generation of the liquid phase in the electrode sintering step S04 improves joinability between the element body 11 and the electrode 15.

(Metal Layer Forming Step S05)

Next, a metal layer 16 is formed on an opposite surface of the electrode 15 from the element body 11. The metal layer 16 can be formed by joining a metal foil material excellent in conductivity, such as nickel, aluminum, or copper, to the electrode 15 by using, for example, a brazing material. As the brazing material, Ag brazing such as Ag—Cu—Zn—Cd and Ag—Cu—Sn can be used.

In the present embodiment, a rolled plate of aluminum, having a thickness of 0.5 mm is cut into the same size as a section of the thermoelectric element, and a metal layer 16 is formed on the electrode 15 using Ag brazing (BAg-1A (JIS)).

According to the steps, the thermoelectric conversion element 10 in which the element body 11 formed of the thermoelectric conversion material of the silicide-based compound and the electrode 15 formed of the sintered body of the copper silicide are directly joined is manufactured.

According to the thermoelectric conversion element 10 described above, since the electrode 15 is formed of the sintered body of the copper silicide, a difference in a thermal expansion coefficient from the element body 11 formed of the thermoelectric conversion material of the silicide-based compound (magnesium silicide) can be reduced, and occurrence of a crack due to thermal history during manufacturing or using can be suppressed.

In addition, since the copper silicide has a relatively low melting point, a liquid phase is generated on a part when forming the sintered body, and thermal strain can be released. The occurrence of a crack in the element body 11 and the electrode 15 during manufacturing can be suppressed.

Further, the electrode 15 and the element body 11 are directly joined, and a liquid phase is generated on a part when forming the sintered body. Accordingly, the joinability between the electrode 15 and the element body 11 is improved. Therefore, electric resistance at an interface can be suppressed to be sufficiently low.

Further, in the present embodiment, since the metal layer 16 is formed on the opposite surface of the electrode 15 from the element body 11, the terminal 3 and the electrode 15 can be relatively easily joined and joinability between the terminal 3 and the electrode 15 can be improved.

In addition, in the present embodiment, since the thickness of the electrode 15 is in the range of 10 µm or larger and 300 µm or smaller, the rigidity of the electrode 15 does not increase more than necessary, and the occurrence of a crack in the element body 11 during manufacturing can be suppressed. Also, the electric conductivity of the electrode 15 can be secured.

Further, in the present embodiment, since the atom number ratio Si/Cu between Si and Cu in the copper silicide forming the electrode 15 is in the range of 0.12 or more and 0.4 or less, the electric conductivity of the electrode 15 can be secured, and the occurrence of a crack in the element body 11 during manufacturing can be suppressed.

As described above, the embodiments of the present invention are described. However, the present invention is not limited thereto, and can be appropriately modified without departing from the technical idea of the present invention. For example, in the present embodiment, it was described that the thermoelectric conversion element and the thermoelectric conversion module having a structure as shown in FIG. 1 are configured. However, the present invention is not limited thereto, and there is no particular limitation on a structure and disposition of the terminals, as long as the thermoelectric conversion element of the present invention is used.

In addition, in the present embodiment, it was described that the silicide-based compound forming element body is the magnesium silicide ($Mg_2Si$). However, the present invention is not limited thereto, and a silicide-based compound having another composition may be used, as long as the compound has a thermoelectric property.

In addition, in the embodiment, a mixture of the copper silicide powders having a plurality of compositions (atom number ratio Si/Cu) is used as the copper silicide powder. However, the present invention is not limited thereto, and a copper silicide powder having a single composition can be used. In this case, the entire electrode can be easily made into a liquid phase and joined to the element body, by controlling the sintering temperature in the electrode sintering step. In this case, since the entire electrode becomes a liquid phase, it is difficult for the electrode to be peeled off from the element body, and the conductivity can also be secured.

EXAMPLES

Hereinafter, results of experiments performed to confirm the effects of the present invention will be described.

A columnar element body (size: diameter 20 mm×thickness 10 mm) formed of a sintered body (porosity 2 volume %) of magnesium silicide ($Mg_2Si$) was prepared. Using the electric sintering apparatus shown in FIG. 3 described in the above embodiment, both surfaces of the element body are filled with powders of materials shown in Table 1 and electric sintering is performed by the above-described method. Electrodes having a constant thickness were formed on both ends of the element body. Accordingly, the thermoelectric conversion elements of Examples 1 to 11 and Comparative Examples 1 to 3 were manufactured. The porosity of the electrode was shown in Table 1. Except for Example 5, a plurality of copper silicide powders having different Si/Cu ratios were mixed and used to obtain ratios shown in Table 1. In Example 5, a copper silicide powder having a single composition having the Si/Cu ratio shown in Table 1 was used.

For the obtained thermoelectric conversion elements of Examples and Comparative Examples, an electric resistance value, the presence or absence of a crack during manufacturing, and a Si/Cu ratio of the electrode were evaluated as follows.

(Electric Resistance)

Figure 4:
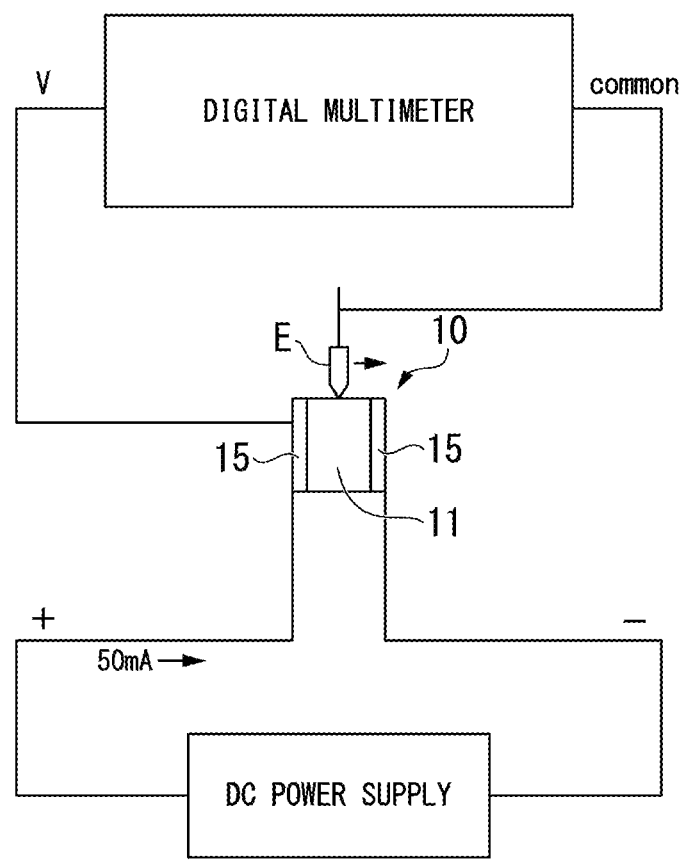
FIG. 4 is an explanatory view showing means for measuring electric resistance in examples of the present invention.

A cubic sample 10 of 10 mm×10 mm×10 mm was cut out from the obtained thermoelectric conversion element and used for evaluation. To measure the electric resistance value, a circuit of FIG. 4 was assembled using a DC power supply and a multimeter, a constant current of 50 mA was applied between both electrodes 15, and each voltage was measured by bringing an electrode E of a digital multimeter into contact with a side surface of the element body 11 from a position 1 mm away from one electrode 15 to a distance of 9 mm at 1 mm intervals. Next, the resistance value was determined from the relationship between the voltage and the current, and a linear approximation was made from the graph of the distance from the electrode end and the resistance value, and an intercept was taken as the electric resistance.

(Crack During Manufacturing)

Regarding the presence or absence of a crack during manufacturing, after the electrodes were formed by electric sintering, the thermoelectric conversion element was visually observed when taken out from the electric sintering apparatus or after cutting to have the thermoelectric conversion element size, and the presence or absence of a crack was confirmed.

(Si/Cu Ratio of Electrode)

Regarding the Si/Cu ratio of the electrode, a Cu amount and a Si amount on the surface of the thermoelectric conversion element (the surface on which the electrode was formed) were measured by EPMA (JXA-8800RL manufactured by JEOL Ltd.), and the Si/Cu ratio was determined.

Specifically, the electrode surface of the cubic sample was polished, and the Cu amount and the Si amount were measured at predetermined five places in the electrode surface by EPMA to determine an average value. In a case where the measurement point was a cavity or at the end of a particle, a center portion of the particle closest to the measurement point was measured.

On the other hand, in Examples 1 to 11 in which the electrodes were formed of copper silicide, no cracks occurred during manufacturing and the electric resistance value was low.

From the above, it was confirmed that, according to Examples 1 to 11, it is possible to provide a thermoelectric conversion element in which an element body formed of a thermoelectric conversion material of a silicide-based compound and an electrode are reliably joined, electric resistance in an interface is sufficiently low, and occurrence of a crack in the element body or the electrode can be suppressed. In Example 11 in which the porosity exceeded 60%, the electric resistance was slightly higher than those of Examples 1 to 10, although lower than that of Comparative Example 3.

INDUSTRIAL APPLICABILITY

According to the thermoelectric conversion element of the present invention, an element body formed of a thermoelectric conversion material of a silicide-based compound and an electrode are reliably joined, electric resistance in an inter-

TABLE 1

| | Material of electrode | Metal layer | Si/Cu in raw material (atom number ratio) | Si/Cu in electrode (atom number ratio) | Thickness of electrode (μm) | Electric resistance value(Ω) | Presence or absence of crack during manufacturing | Porosity of electrode (%) |
|---|---|---|---|---|---|---|---|---|
| Example 1 | Copper silicide | — | 0.33 | 0.29 | 50 | 0.0038 | none | 15 |
| Example 2 | Copper silicide | — | 0.33 | 0.30 | 100 | 0.0034 | none | 10 |
| Example 3 | Copper silicide | — | 0.33 | 0.32 | 300 | 0.0035 | none | 8 |
| Example 4 | Copper silicide | — | 0.14 | 0.13 | 100 | 0.0037 | none | 11 |
| Example 5 | Copper silicide | — | 0.33 | 0.33 | 100 | 0.0033 | none | 0 |
| Example 6 | Copper silicide | Aluminum | 0.33 | 0.31 | 100 | 0.0038 | none | 13 |
| Example 7 | Copper silicide | Copper | 0.33 | 0.31 | 100 | 0.0034 | none | 7 |
| Example 8 | Copper silicide | Nickel | 0.33 | 0.30 | 100 | 0.0039 | none | 10 |
| Example 9 | Copper silicide | — | 0.33 | 0.31 | 100 | 0.0062 | none | 57 |
| Example 10 | Copper silicide | — | 0.33 | 0.32 | 100 | 0.0047 | none | 8 |
| Example 11 | Copper silicide | — | 0.33 | 0.31 | 100 | 0.0097 | none | 66 |
| Comparative example 1 | Nickel silicide | — | — | — | 100 | — | occurred | — |
| Comparative example 2 | Nickel | — | — | — | 100 | — | occurred | — |
| Comparative example 3 | Aluminum | — | — | — | 100 | 0.1900 | none | 45 |

In Comparative Example 1 in which the electrode was formed of nickel silicide, a crack occurred during manufacturing. Therefore, the electric resistance value and the porosity of the electrode were not evaluated. In Comparative Example 2 in which the electrode was formed of nickel, a crack occurred during manufacturing. Therefore, the electric resistance value and the porosity of the electrode were not evaluated. In Comparative Example 3 in which the electrode was formed of aluminum, no crack occurred during manufacturing, but the electric resistance value was extremely high 0.19Ω.

face is sufficiently low, and occurrence of a crack in the element body or the electrode can be suppressed. Therefore, the present invention is industrially applicable.

REFERENCE SIGNS LIST

1 Thermoelectric conversion module
3 Terminal
10 Thermoelectric conversion element
11 Element body
15 Electrode
16 Metal layer

What is claimed is:

1. A thermoelectric conversion element comprising:
an element body formed of a thermoelectric conversion material of a silicide-based compound; and
electrodes each formed on one surface of the element body and the other surface opposite the one surface,
wherein the electrodes are formed of a sintered body of a copper silicide,
the electrodes and the element body are directly joined,
each of the electrodes has a liquid phase solidified portion formed by solidification of a liquid phase and a region where the liquid phase is not formed,
the liquid phase solidified portion has fewer pores and a locally higher density than the region where the liquid phase is not formed,
an atom number ratio Si/Cu between Si and Cu in the copper silicide is 0.12 or more and 0.4 or less, and
a porosity of the copper silicide is more than 0% and 60% or lower.

2. The thermoelectric conversion element according to claim 1, wherein a metal layer is formed on an opposite surface of each of the electrodes, from the element body.

3. The thermoelectric conversion element according to claim 1, wherein a thickness of each of the electrodes is 10 μm or larger and 300 μm or smaller.

4. Thermoelectric conversion element according to claim 1, wherein an atom number ratio Si/Cu between Si and Cu in the copper silicide is 0.13 or more and 0.35 or less.

5. The thermoelectric conversion element according to claim 1, wherein a porosity of the copper silicide is more than 0% and 50% or lower.

6. The thermoelectric conversion element according to claim 2, wherein a thickness of each of the electrodes is 10 μm or larger and 300 μm or smaller.

7. Thermoelectric conversion element according to claim 2, wherein an atom number ratio Si/Cu between Si and Cu in the copper silicide is 0.13 or more and 0.35 or less.

8. Thermoelectric conversion element according to claim 3, wherein an atom number ratio Si/Cu between Si and Cu in the copper silicide is 0.13 or more and 0.35 or less.

9. Thermoelectric conversion element according to claim 6, wherein an atom number ratio Si/Cu between Si and Cu in the copper silicide is 0.13 or more and 0.35 or less.

10. The thermoelectric conversion element according to claim 2, wherein a porosity of the copper silicide is more than 0% and 50% or lower.

11. The thermoelectric conversion element according to claim 3, wherein a porosity of the copper silicide is more than 0% and 50% or lower.

12. The thermoelectric conversion element according to claim 4, wherein a porosity of the copper silicide is more than 0% and 50% or lower.

13. The thermoelectric conversion element according to claim 6, wherein a porosity of the copper silicide is more than 0% and 50% or lower.

14. The thermoelectric conversion element according to claim 7, wherein a porosity of the copper silicide is more than 0% and 50% or lower.

15. The thermoelectric conversion element according to claim 8, wherein a porosity of the copper silicide is more than 0% and 50% or lower.

16. The thermoelectric conversion element according to claim 9, wherein a porosity of the copper silicide is more than 0% and 50% or lower.

* * * * *